US011349277B2

(12) United States Patent
Kupcho (10) Patent No.: US 11,349,277 B2
(45) Date of Patent: May 31, 2022

(54) IN-SITU BIAS VOLTAGE MEASUREMENT OF VCSELS (71) Applicant: Lumentum Operations LLC, San Jose, CA (US)

(72) Inventor: Kevin M. Kupcho, Albuquerque, NM (US)

(73) Assignee: Lumentum Operations LLC, San Jose, CA (US)

(*) Notice: Subject to any disclaimer, the term of this patent is extended or adjusted under 35 U.S.C. 154(b) by 57 days.

(21) Appl. No.: 16/680,404

(22) Filed: Nov. 11, 2019

(65) Prior Publication Data
US 2020/0153195 A1 May 14, 2020

Related U.S. Application Data (60) Provisional application No. 62/767,302, filed on Nov. 14, 2018.

(51) Int. Cl.
H01S 5/00 (2006.01)
H01S 5/042 (2006.01)
G01R 31/28 (2006.01)
G01R 31/26 (2020.01)
H01S 5/068 (2006.01)
H01S 5/024 (2006.01)
H01S 5/183 (2006.01)

(52) U.S. Cl.
CPC ........ H01S 5/0014 (2013.01); G01R 31/2635 (2013.01); G01R 31/2837 (2013.01); H01S 5/0021 (2013.01); H01S 5/042 (2013.01); H01S 5/06825 (2013.01); H01S 5/02469 (2013.01); H01S 5/0428 (2013.01); H01S 5/183 (2013.01)

(58) Field of Classification Search
None
See application file for complete search history.

(56) References Cited

U.S. PATENT DOCUMENTS 5,515,392 A 5/1996 Teremy
7,440,865 B1 * 10/2008 Hofmeister .......... G01R 31/002
  398/135
8,009,709 B2 8/2011 Nelson
(Continued)

OTHER PUBLICATIONS

International Patent Application No. PCT/US2019/060793; Int'l Search Report and the Written Opinion; dated Jan. 22, 2020; 7 pages.

Primary Examiner — Tod T Van Roy
(74) Attorney, Agent, or Firm — Harrity & Harrity, LLP (57) ABSTRACT Systems, methods, and devices are described for in-situ testing of vertical-cavity surface-emitting lasers (VCSELs), VCSEL arrays or laser diodes (each a laser). Testing may comprise bias voltage measurements of one or more lasers. Embodiments may comprise one of a laser, a driver circuit providing a bipolar drive to the laser, and a sensing circuit to measure and/or monitor damage or degradation of the laser. The bipolar drive may comprise a pulsed forward bias output configured to produce a light output during an on-time of the laser, and a pulsed reverse bias output during an off-time of the pulsed forward bias output. The pulsed outputs may comprise a variable, chirped frequency. One or more of a reverse leakage current, and a junction temperature may be measured to monitor a state of health of the laser.

21 Claims, 8 Drawing Sheets (56) References Cited

U.S. PATENT DOCUMENTS

| | | | |
|---|---|---|---|
| 8,670,473 B2 | 3/2014 | Azadeh et al. | |
| 9,746,369 B2 | 8/2017 | Shpunt et al. | |
| 2006/0016959 A1* | 1/2006 | Nishimura | G01J 3/10 |
| | | | 250/205 |
| 2006/0104328 A1* | 5/2006 | Crews | H01S 5/0261 |
| | | | 372/50.124 |
| 2017/0131345 A1* | 5/2017 | Koellner | H05B 45/37 |
| 2017/0269146 A1* | 9/2017 | Regau | G01R 31/52 |
| 2018/0351325 A1* | 12/2018 | Tanaka | H01S 5/042 |
| 2019/0004105 A1* | 1/2019 | Henley | G01R 31/002 |

* cited by examiner

IN-SITU BIAS VOLTAGE MEASUREMENT OF VCSELS

CROSS REFERENCE TO RELATED APPLICATION

This application claims the benefit of U.S. Provisional Patent Application No. 62/767,302, filed Nov. 14, 2018.

TECHNICAL FIELD

This disclosure relates generally to vertical-cavity surface-emitting lasers (VCSELs), and more specifically, to in-situ testing of VCSELs.

BACKGROUND

Reverse biasing a laser diode, including vertical-cavity surface-emitting lasers (VCSELs), results in a very low leakage current. If the reverse voltage is increased from a lower to a higher voltage, leakage current will gradually increase until the reverse breakdown limit of the laser diode structure is achieved. After the breakdown limit, current rapidly increases up to a maximum value, at which point permanent damage of the laser diode can result. Reverse bias leakage of a laser diode is a sensitive probe of a condition of the junction region of the device, and as such, may indicate excessive junction heating, electrostatic discharge, pre-failure crystallographic defects of VCSELs, and other conditions of a VCSEL or VCSEL array's state of health.

SUMMARY

The disclosed systems, methods, and devices provide modifications to common laser diode driver circuits that allow in-situ testing of a laser diode, especially VCSELs and VCSEL arrays. The disclosure contains unique uses and applications of such circuit modifications to make diagnostic measurements of interest for various laser diode applications. For example, the diagnostic tests may be applied to test a laser diode for quality control purposes, monitor a state of health in operations, or provide direct feedback to a controller for predicting failure or extending the life of laser diodes.

In an embodiment, a system comprises a VCSEL; a VCSEL driver circuit comprising a bipolar drive providing a pulsed forward bias output producing a light output of the VCSEL, and a pulsed reverse bias output during an off-time of the pulsed forward bias output; and a sensing circuit to monitor damage or degradation of the VCSEL. In another embodiment, the sensing circuit measures a reverse leakage current through the VCSEL driver circuit during the off-time of the pulsed forward bias output. The sensing circuit may also monitor the reverse bias leakage current relative to a breakdown threshold, and/or provide feedback to a control circuit, based on at least one of a reverse bias leakage current and a VCSEL junction temperature, to adjust current drive levels to extend a life of the VCSEL.

In another aspect of an embodiment, the VCSEL driver circuit may apply a voltage ramp up to a reverse breakdown voltage avalanche knee to monitor a health state of the VCSEL. The sensing circuit may measure the junction temperature of the VCSEL. Various embodiments may further comprise a dedicated test fixture for acceptance testing of the VCSELs, laser diodes, or arrays.

In another embodiment, the pulsed reverse bias output comprises a plurality of frequencies, which may be adjusted to optimize at least one of an optical power output and an optical pulse shape. At least one of the pulsed forward bias output and the pulsed reverse bias output may comprise a variable chirped frequency.

BRIEF DESCRIPTION OF THE DRAWINGS

Various non-limiting embodiments are further described with reference to the accompanying drawings in which.

DETAILED DESCRIPTION OF ILLUSTRATIVE EMBODIMENTS

Various aspects of the present disclosure described herein in are generally directed to devices, systems and methods for, among other things, in-situ testing of one or more VCSELs or VCSEL arrays. Testing may comprise bias voltage measurements of the VCSEL systems, junction temperature measurements, and one or more adjustments to current drive levels to measure and/or monitor a state of health of the VCSEL system.

VCSEL Systems

Figure 1:
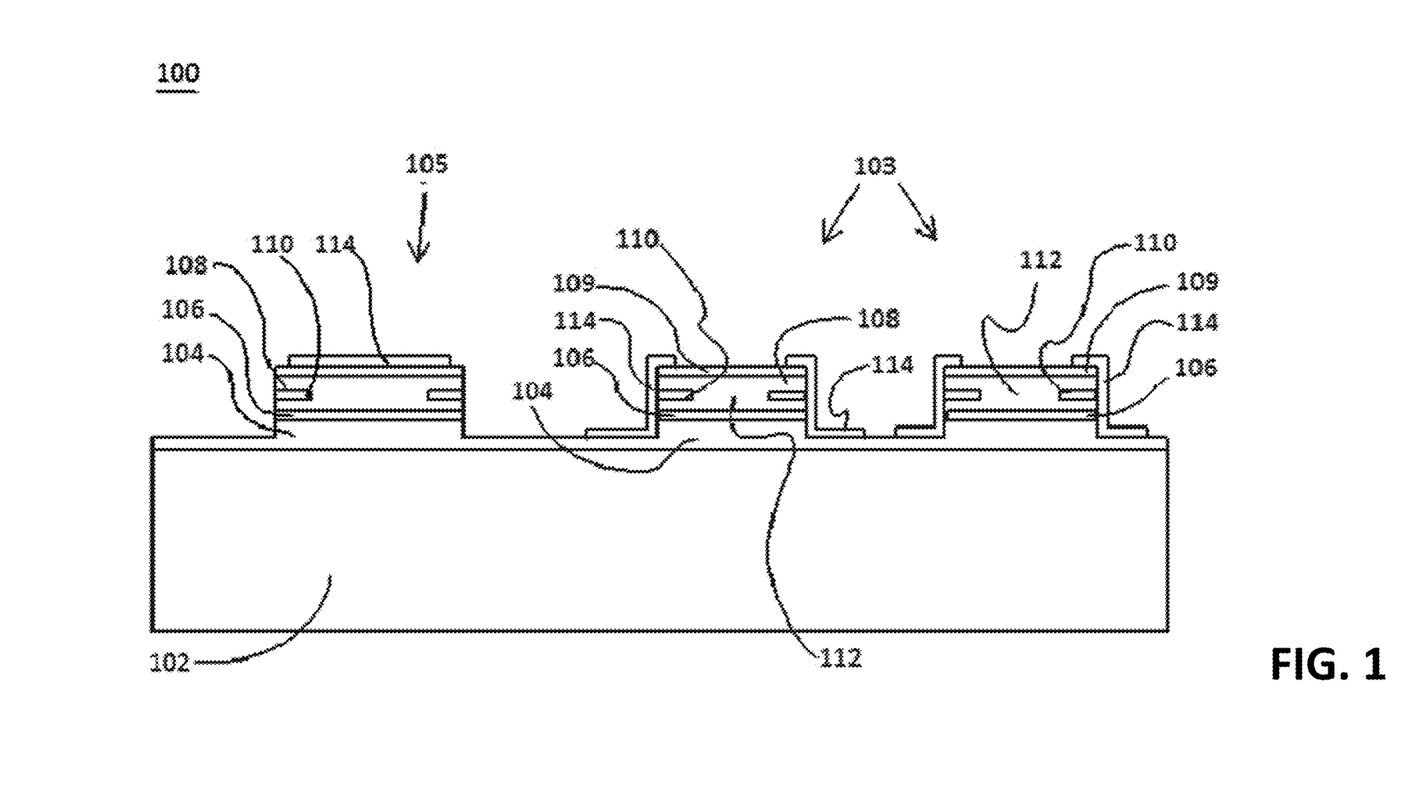
FIG. 1 is a simplified cross-sectional view illustrating the mesa structures of both the VCSEL devices and the shorting mesa devices, including dielectric deposition, metal deposition, and oxidation structures, among others features in accordance with an embodiment.

FIG. 1 illustrates a simplified schematic cross-section of VCSEL array device 100 in accordance with an embodiment. It will be understood that the illustration of the VCSEL array device in the embodiment shows a semiconductor device array and a method of fabricating and bonding the semiconductor device array. It will be understood, however, that the method disclosed therein can be used to fabricate arrays of other semiconductor devices, such as light emitting diodes, photodetectors, edge-emitting lasers, modulators, high electron mobility transistors, resonant tunneling diodes, heterojunction bipolar transistors, quantum dot lasers and the like. Further, it will be understood that the illustration of VCSEL array device 100 in the embodiment is for illustrative purposes only and is in no way meant to limit the scope of the invention.

In the embodiment, VCSEL array device 100 includes a substrate 102 which includes Gallium Arsenide (GaAs), although other materials such as Indium Phosphide (InP), Indium Arsenide (InAs), Silicon (Si), an epitaxially grown material, and the like, could be used to form the substrate 102. It will also be understood that substrate 102 typically includes a lattice constant chosen to minimize defects in a material layer subsequently grown thereon. It will also be understood that the choice of at least one of the compositions and the thicknesses of the subsequently grown material layers will provide a desired wavelength of operation. Subsequent layers are deposited on the substrate 102 via epitaxial growth using Molecular Beam Epitaxy (MBE), Metal-Organo-Chemical Vapor Deposition (MOCVD), and the like.

In the embodiment, a lattice-matched lower Distributed Bragg Reflector (DBR) 104 is epitaxially deposited on substrate 102 to form the first of the raised layers of the VCSEL mesas 103 and the short-circuiting/shorting/grounding mesa 105. The lower DBR 104 is formed from multiple layers of alternating materials with varying (a high and a low) indexes of refraction, or by periodic variation of some characteristic, such as height, of a dielectric waveguide, resulting in periodic variation in the effective refractive index in the guide. Each layer boundary causes a partial reflection of an optical wave, with the resulting combination of layers acting as a high-quality reflector at a desired wavelength of operation. Thus, while the lower DBR 104 (and upper DBR 108, as further described below) includes more than one material layer, it is illustrated in FIG. 1 as being comprised of a single layer for simplicity and ease of discussion herein. A portion of lower DBR 104 can also be made conductive to allow an electrical contact (not shown) to be made to the VCSEL array device.

In the embodiment, an active region 106 is epitaxially deposited on lower DBR 104. Although shown as a single layer (again for simplicity and ease of discussion), active region 106 comprises cladding (and/or waveguiding) layers, barrier layers, and an active material capable of emitting a substantial amount of light at a desired wavelength of operation. In the embodiment, the wavelength of operation is a wavelength within a range approximately given from about 620 nm to about 1600 nm (for a GaAs substrate). However, it will be understood that other wavelength ranges may be desired and will depend on the application.

As is understood by those skilled in the art, the wavelength of emission is substantially determined according to the choice of materials used to create lower DBR 104 and upper DBR 108, as well as the composition of the active region 106. Further, it will be understood that active region 106 can include various light emitting structures, such as quantum dots, quantum wells, or the like. In the embodiment, upper DBR 108 is positioned on active region 106, and like lower DBR 104, is electrically conductive to allow ohmic electrical connections to be formed (not shown). In some embodiments, lower DBR 104 is n-doped and upper DBR 108 is p-doped, but this can be reversed, where lower DBR 104 is p-doped and upper DBR 108 is n-doped. In other embodiments, electrically insulating DBRs can be employed (not shown), which utilize intra-cavity contacts and layers closer to the active region.

In some embodiments, an upper mirror contacting layer 109 is positioned on upper DBR 108. Contacting layer 109 is typically heavily doped so as to facilitate ohmic electrical connection to a metal deposited on contacting layer 109, and hence to an electrical circuit (not shown). In some embodiments, contacting layer 109 can be formed as part of upper DBR 108.

Lithography and etching can be used to define each of the mesas 103 and 105 and their structures stated above. This can be achieved by patterning the epitaxially-grown layers through a common photolithography step, such as coating, exposing, and developing a positive thick resist. The thickness of the resist can be varied as is known in the art, depending on etch-selectivity between the resist and the epitaxial layers, and the desired mesa geometry.

For GaAs-based materials, etching is usually accomplished using a Chlorine (Cl) based dry etch plasma, such as $Cl_2:BCl_3$, but any number of gases or mixtures thereof could be used. Etching can also be accomplished by many wet etchants. Other forms of etching, such as ion milling or reactive ion beam etching and the like, can also be used. The depth of the etch is chosen to be deep enough to isolate the active regions of mesas in the array. The etch stops either on the N mirror (lower DBR 104), an etch stop/contact layer formed in the N mirror (lower DBR 104), or through the N mirror (lower DBR 104) into the substrate 102. After etching to form the mesas, the remaining photoresist is removed. This can be achieved using a wet solvent clean or dry Oxygen ($O_2$) etching or a combination of both.

A confinement region 110 can also be formed within each of the mesas. Within the VCSEL mesas 103, the confinement region 110 defines an aperture 112 for the device. The confinement region 110 can be formed as an index guide region, a current guide region, and the like, and provides optical and/or carrier confinement to aperture 112. Confinement regions 110 can be formed by oxidation, ion implantation and etching.

Aluminum (Al) content layer (or layers) can be achieved by timing the placement of the wafer or sample in an environment of heated Nitrogen ($N_2$) bubbled through Water ($H_2O$) and injected into a furnace generally over 400° C. A photolithographic step to define an ion implant area for current confinement, and combinations of these techniques and others known in the art, can also be used.

It will be understood that confinement region 110, defining aperture 112, can include more than one material layer, but is illustrated in the embodiment as including one layer for simplicity and ease of discussion. It will also be understood that more than one confinement region can be used.

In the embodiments shown in the Figures, the mesa size, and apertures of the light producing VCSELs are the same and have uniform spacing. However, in some embodiments, the individual VCSEL mesa size for the devices in an array can differ. Furthermore, the VCSEL mesa spacing in the array can differ. In some embodiments, the separation of the light producing VCSELs mesas in an array 100 is between approximately 20 μm and 200 μm. However, larger and smaller separations are also possible.

Dielectric deposition can be used and processed to define an opening for a contact surface. First, the deposition of a dielectric material 114 over the entire surface of the device 100 is usually accomplished by Plasma Enhanced Chemical Vapor Deposition (PECVD), but other techniques, such as Atomic Layer Deposition (ALD), can be used. In the embodiment, the dielectric coating 114 is a conformal coating over the upper surface (including the mesa sidewalls) and is sufficiently thick so as to prevent current leakage through pinholes from subsequent metal layers.

Other properties to consider while choosing the thickness of this film is the capacitance created between the plated metal heat sink 124 (further described below with reference to FIG. 2) and the substrate 102 ground, where the dielectric layer 114 would be more beneficial to be thicker, and the need for the dielectric layer 114 on the sidewalls of the VCSEL 103 to transfer heat from the active region to the heat sink 124, where a thinner layer would be beneficial. In some embodiments, multiple depositions using different deposition techniques can be used to accomplish a layer with both of these properties. An example of this technique is to follow a deposition of PECVD Silicon Nitride ($Si_3N_4$) with an E-beam deposition of $Si_3N_4$, or another dielectric could be deposited that has a more directional deposition rate, thereby putting thicker dielectric material on the incident surfaces. Once the dielectric layer 114 has been formed, a photolithographic process is then used to define openings in the dielectric over each of the VCSELs mesas where contact is to be made to the top mirror contact layer 109. The dielectric layer 114 is also removed over the substrate 102 between each of the VCSEL mesas 103, over the substrate 102 surrounding the ground mesa 105, and over the top and side of each ground mesa 105.

Figure 2:
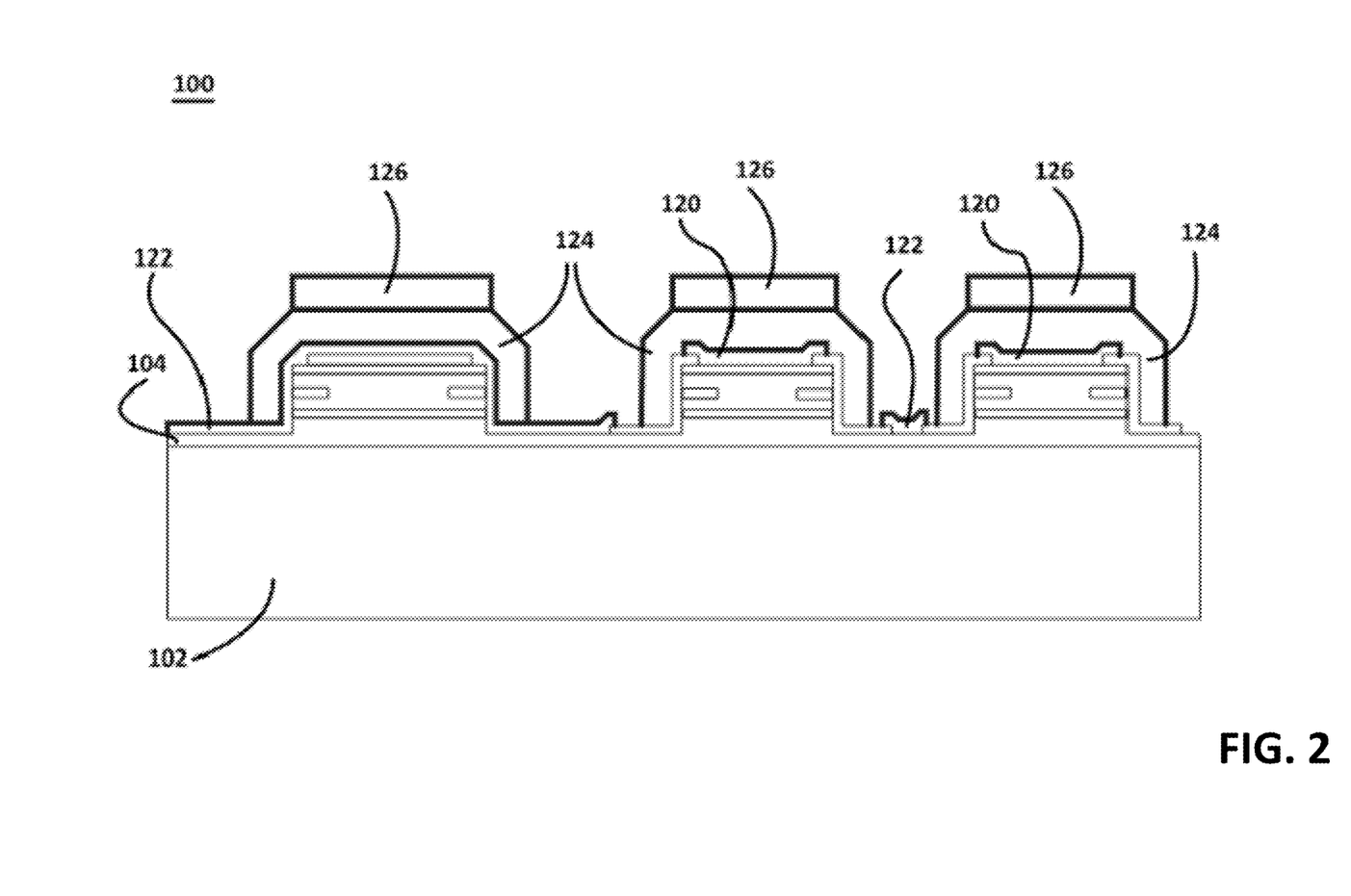
FIG. 2 is another simplified cross-sectional view of the VCSEL devices and the shorting mesa devices, further illustrating heat sinks, bonding layers, and other features in accordance with an embodiment.

Turning now to FIG. 2, the next processing step is a photolithographic process that is used to define the contacts over the top mirrors 108, where the dielectric was opened in the above step, so that a p-metal layer can be formed therein in a subsequent step. In the embodiment, the opened area in the photoresist is slightly larger than the opening in the dielectric, typically of the order of a few μm wider. In other embodiments, its diameter can be smaller than the diameter of the dielectric opening, or as large as the diameter of the heat sink material over the shorted mesas, which is plated at a later step. This opening could not be any larger than the mesa diameter in an active light producing mesa or the subsequent metals would short out the p- and n-potentials, unless the dielectric coating is conformal and covering the N mirror portion at the mesa base.

Once the opened areas in the photoresist are defined, metalization can be performed, typically with a p-type metal, over the opened areas. The p-metal contact layer 120 is usually a multilayer deposition that is deposited by E-beam, resistive evaporation, sputter, or any other metal deposition techniques. A thin Titanium (Ti) layer is first deposited for adhesion of the next layer. The thickness of this adhesion layer can vary greatly, but is generally chosen to be between about 50 Å and about 400 Å as the Ti films are stressful and more resistive than the subsequent layers. In an embodiment, the adhesion layer is approximately 200 Å thick. Other adhesive metal layers can be substituted for this layer such as Chromium (Cr), Palladium (Pd), Nickel (Ni), and the like. Also, this layer can serve as a reflector layer to increase reflectance of the contacting mirror.

The next layer is deposited directly on top of the adhesion layer without breaking vacuum during the deposition. In many cases this layer acts as a guard against the Gold (Au) or other top metals from diffusing too far into the contact (a diffusion barrier) because of excessive heating at the bonding stage. Metals chosen are generally Pd, Platinum (Pt), Ni, Tungsten (W), or other metals or combinations of these metals chosen for this purpose. The thickness chosen should depend upon specific bonding temperatures needed in the flip chip process. The thickness of this layer is typically between about 1,000 Å and about 10,000 Å. In embodiments where a low temperature bonding process is used, for example, in an Indium bonding process, a diffusion barrier layer can be optional, and not deposited as part of the metal contact stack.

The next layer is generally Au but can be Pd or Pt or mixtures such as Gold Beryllium (AuBe) or Gold Zinc (AuZn). In the embodiment described below, the thickness of this layer is approximately 2,000 Å. However, it can generally have a wide range of thicknesses depending on the photo resist properties and heating characteristics of the deposition. In some embodiments, another metal can also be deposited at this time to increase metal thickness and to form the metal heat sink at this stage, thereby reducing the number of processing steps, but this technique is not necessary and was not utilized in the demonstration devices described below.

Generally, a common liftoff technique is chosen for this photolithographic process so that the metal deposited on the surface can easily be separated from the areas of the surface covered with photoresist, such that any metal on the photoresist is removed without sticking to or affecting the adhesion of the metal to the semiconductor. As noted above, a photolithographic process is then used to define the openings over various portions of the substrate 102 and the shorted n-contact mesas 105, where the dielectric was opened in a previous step. In an embodiment, the opened area in the photoresist corresponding to the n-metal deposition should be slightly larger than the opening in the dielectric openings for the n-metal. N-metal layer 122 is then deposited and can form an electrical circuit with the substrate 102 either through the lower DBR 104 (if an n-mirror), an etch stop and contact layer which is generally heavily doped within lower DBR 104, or to substrate 102 itself. The process to form the n-metal layer 122 is similar to that for the p-metal layer 120. The metal layers can be chosen to include the combinations of Ni/Ge/Au, Ge/Au/Ni/Au, or many such combinations. In some embodiments, the first layer or layers are chosen to reduce contact resistance by diffusion into the n-doped epitaxial material of the substrate 102. In other embodiments, the first layer of the multi-layer metal stack can also be chosen as a diffusion-limiting layer such as Ni so that in the annealing process the metals do not "clump" and separate due to the various diffusion properties of the materials. Evenly distributing diffusion of these metals is desired and can be used to lower the contact resistance which also reduces heating. The thickness of this multi-layer metal stack can vary greatly. In the embodiment to be described, a Ni/Ge/Au metal stack with thicknesses of 400 Å/280 Å/2,000 Å, respectively, was used.

A Rapid Thermal Anneal (RTA) step is then performed on the wafer in order to lower contact resistance. For the embodiment described, the process temperature is rapidly ramped up to ~400° C., held for about 30 seconds and ramped down to room temperature. The temperature and time conditions for the RTA step depend on the metalization, and can be determined using a Design Of Experiment (DOE), as known to those of ordinary skill in the art.

In other embodiments, this step can be performed at an earlier or later stage of the process flow, but is generally done before solder is deposited so as to reduce oxidation of the solder or adhesive metal. A photolithographic process (using a thin layer of photoresist, typically around 1 μm to 3 μm, is used and developed to define the contact openings over the substrate 102 and shorted N contact mesas 105, and active mesas 103 where the heat sink structures will be plated or built up. The next step is deposition of the metal seed layer and is usually a multilayer deposition and deposited by E-beam, resistive evaporation, sputter or any other metal deposition techniques. The metal layers can be chosen such as Ti/Au, 20 Å/600 Å, or many such combinations where the first layer or layers is deposited for adhesion and ease to etch off, and the second layer for conductivity and ease to etch off. The seed layer is continuous over the surface allowing electrical connections for plating, if this technique is used for building up the heat sinks.

In an embodiment, a thick metal is then deposited by plating, to form heat sink 124. However, other methods of deposition can also be used, in which case the metal seed layer is not required. For plating, a photolithographic process is used to define the openings over the openings defined with the previous seed layer resist. The photoresist is removed in the areas where the deposition will occur. The thickness of the photoresist must be chosen so that it will lift off easily after the thick metal is defined and typically ranges in thickness from about 4 μm to about 12 μm. A plasma clean using $O_2$, or water in combination with Ammonium Hydroxide, ($NH_4OH$), is performed to clear any of the resist left on the gold seed layer. The heat sink 124 metal is plated next by means of a standard plating procedure. In the embodiment described, Copper (Cu) was chosen as the metal for plating due to its thermal conductance properties, but non-oxidizing metals, such as Au, Pd, Pt, or the like, that provide good thermal conductance and provide an interface that does not degrade device reliability, could be more appropriate. Plating thicknesses can vary. In the embodiment described, an approximately 3 μm thickness was used.

Next the wafer or sample is placed in a solder plating solution such as Indium (In) plating to form a bonding layer 126. Other metals can be chosen at this step for their bonding characteristics. The thickness can vary greatly. In the embodiment described, approximately 2 μm of plated. In was deposited on the heat sinks. However, other solders such as Gold Tin (AuSn) alloys can also be used, and alternative deposition techniques such as sputtering can also be used. After metal deposition is complete, the photoresist is then removed using solvents, plasma cleaned, or a combination of both, as previously described, and the seed layer is etched with a dry or wet etch that etches Au, then etched in a dry or wet etch that etches Ti and/or removes $TiO_2$. The seed layer photoresist is then cleaned off with standard resist cleaning methods. At this point, the VCSEL array substrate is complete and ready for bonding.

The full encasement of the mesas with a thick heat sink material is an important aspect of the embodiment. Since the active regions of the mesas are closest to the edge where the thick heat sink material is formed, there is good thermal conductance, thereby enabling the design of the embodiment to efficiently and effectively remove heat generated by those active regions. As previously noted, this is a significant departure from existing VCSEL array device heat reduction techniques, which place the heat sink material on top of the mesa. These existing or prior designs require heat to move through a series of higher thermally conductive materials (mirrors) or dielectrics, thereby resulting in less efficient and effective heat reduction.

Although some existing designs encompass the mesa with a thin layer of heat sink material, for the purpose of reducing heat, these designs do not take into the consideration the height of the resulting heat sink. By using a thick heat sink layer and adding to the distance between the n-substrate ground potential and the p-contact plane on the heat sink substrate, present embodiments decrease parasitic capacitance of the system as the height of the heat sink layer is increased. Further, in addition to reducing heat, the build-up of additional material increases frequency response. In another embodiment, the dielectric layer 114 covers the entire n-mirror or substrate around the mesas and is not opened so that the heat sink material can completely encompass all mesas and form one large heat sink structure, instead of individual mesas of heat sinks. In this case, the n-contacts would only be needed to extend from the short circuited mesas to the substrate. The heat sinks of the embodiment also improve the operation of the VCSEL array by reducing the amount of heat generated by neighboring mesas. A reduction in thermal resistance within most electrical devices will increase the frequency response of each device. By improving the thermal performance of the VCSEL array device of the present device, a significant increase in the high speed performance of the VCSEL array device is made possible. Furthermore, in this embodiment it is also evident that the extra height given the mesas, because of the thickened heat sinking build up compared to the existing array circuits, reduces capacitance by increasing the distance between the substrate ground plane and the positive contact plate connecting all active mesas in parallel. The resultant effect is a reduction in parasitic impedance of the circuit which also increases the frequency response of the entire array.

Also, the short circuited mesa design, which forms a sub-array surrounding the active regions, allows current flow directly from the fabricated VCSEL substrate to the ground plane on the heat spreader without the use of forming multiple wire bonds. This aspect of the embodiment reduces the complexity of fabrication, and also reduces parasitic inductance from the multiple wire bonds exhibited in the existing arrays. The short circuited mesa design, when flipped chipped to the heat spreader substrate, forms a coplanar waveguide which is beneficial to the frequency response of the array. This design feature also enables simpler packaging designs that do not require raised wire bonds, which also impact reliability and positioning.

In-Situ $V_{br}$ Generation

Figure 3:
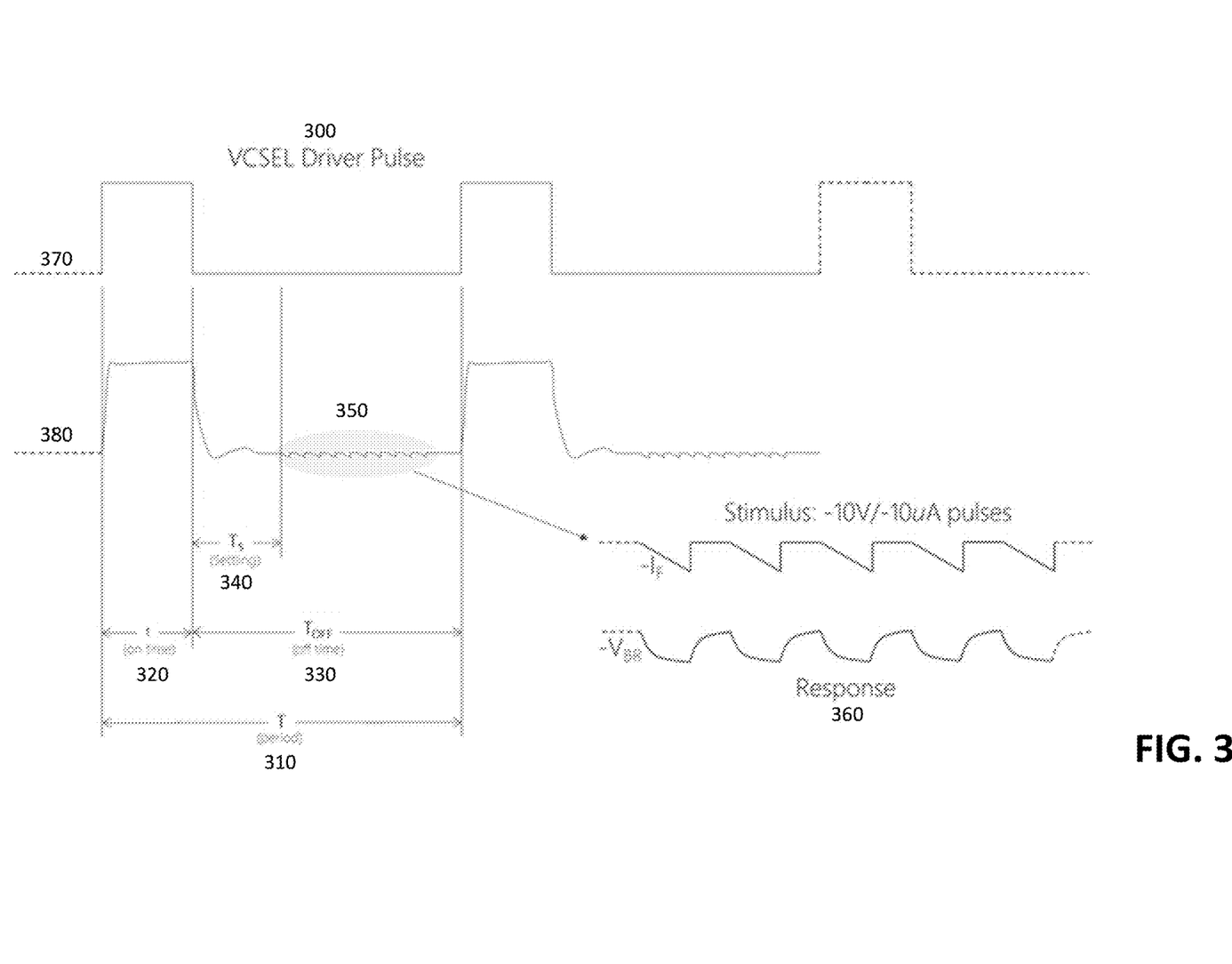
FIG. 3 illustrates an exemplary driver pulse for in-situ measurement of pulsed-ramp voltage breakdown during the off-time of the driver pulse, in accordance with an embodiment.

In-situ testing of one or more VSCELs or VSCEL arrays may predict VSCEL failure using Voltage Breakdown slope monitoring. FIG. 3 graphically illustrates an exemplary driver pulse 300 for performing in-situ testing of VCSELs and laser diodes, such as those fabricated in the manner described above. The depicted concept utilizes the off-time 330 of a forward biased pulse 370 to implement a pulsed-ramp Voltage Breakdown ($V_{br}$) measurement of one or more VCSELs or VCESEL arrays. The $V_{br}$ measurement reveals the largest reverse bias voltage that can be applied to a VSCEL without causing an exponential increase in a reverse bias current ($-\Delta I_f$) and permanent damage to the VSCEL. Embodiments incorporate a bipolar drive comprising a forward biased pulse 370 and a reverse bias pulse 350 during the off times 330 of the forward pulse. The slope-monitoring Voltage Breakdown measurement may be characterized by:

$$V_{br} = -\Delta I_f / \Delta V_f \qquad \text{Equation (1):}$$

wherein $-I_f$ represents the reverse-bias current, and $V_f$ represents the forward bias voltage.

As depicted in FIG. 3, embodiments for predicting VCSEL failure incorporate a bipolar, pulsed power supply, wherein a first power supply provides a high-current forward bias normally used to drive a VCSEL, and a second power supply provides an ultra-low, constant current and a constant voltage. The driver pulse 300 comprises a time period, T, 310, including an on-time, $T_{on}$, 320 for the forward bias pulse, and an off-time, $T_{off}$, 330, during which the reverse bias stimulus 350 may be provided.

Pulse illustration 370 indicates the on-off time for VCSEL driver pulse 300, and the VCSEL response is illustrated by element 380. The VCSEL response 380 illustrates measurable voltage during the $T_{on}$ phase of the driver pulse 300, followed by significant drop and voltage variability during a first portion of time after which the forward bias supply is turned off, i.e., settling time, $T_s$, 340. After the settling time 340, a reverse bias stimulus 350 may be provided until close to the next period.

The reverse bias pulse scheme 350, enabled after the $T_s$ settling time 340, may vary in the number of $-I_f$ pulses provided. In other embodiments, the ramp rate of the pulses may be changed depending, for example, on the duty cycle of the pulse train driving the VCSEL. As illustrated, the $-I_f$ pulse scheme may comprise $-10V/-10$ µA pulses, provided in a saw tooth pattern. The VCSEL response 360 to the $-I_f$ pulses may be measured according to $V_{br}$ to identify any changes or inconsistencies that may indicate and/or predict a failure of the VCSEL.

A sensing circuit may be incorporated in one or more embodiments to measure the reverse leakage current, $-I_f$, through the one or more laser diodes, or arrays. In an embodiment, a circuit with an intermittent reverse bias capability and reverse current measurement may also be used to monitor one or more of a reverse bias leakage below breakdown, reverse bias applied as a voltage ramp up to the reverse breakdown voltage avalanche knee, and junction temperature of the laser diodes or arrays. The described circuits may monitor a state of health of the laser diodes or arrays, including damage and degradation, which may have occurred during operation, use or acceptance testing.

In embodiments, one or more circuits described herein may provide feedback to a control circuit. In response, the control circuit may raise, reduce, and adjust current drive levels to extend the life of laser diodes or arrays. In embodiments, a frequency-modulated reverse bias pulse train may be applied to the one or more VCSELs or VCSEL arrays to analyze the frequency-dependent aspects of the reverse bias leakage current as a probe of the device structure for acceptance testing. In other embodiments, the frequency-modulated reverse bias pulse may be adjusted to tune one or more drive circuit characteristics to obtain an optimum optical pulse shape.

Figure 4A:
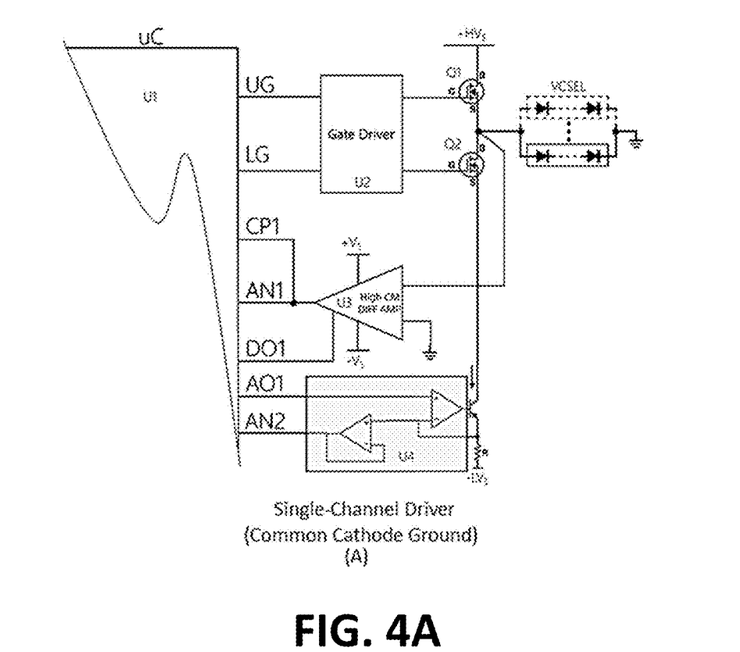
FIG. 4A illustrates an exemplary driver architecture in which VSCEL devices are driven in a single-channel common cathode arrangement, in accordance with an embodiment.
Figure 4B:
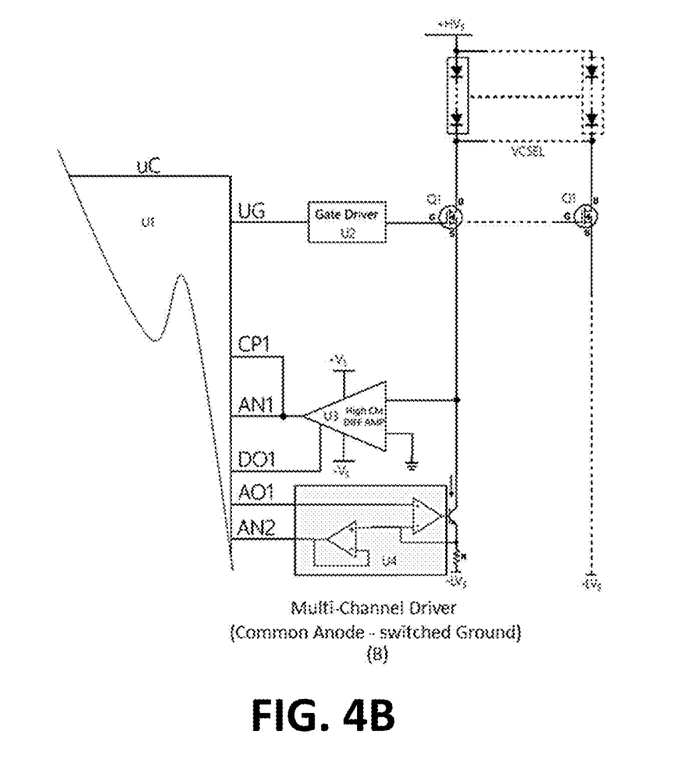
FIG. 4B illustrates an exemplary driver architecture in which VSCEL devices are driven in a multi-channel common anode arrangement in accordance with an embodiment.

FIGS. 4A and 4B illustrate exemplary architectures upon which in-situ testing of VCSELs, laser diodes, and arrays may be implemented. FIG. 4A depicts a single-channel driver having a common cathode ground, and FIG. 4B depicts a multi-channel driver having a common anode with switched ground.

The driver depicted in FIG. 4A may drive one or more VCSELs having configurations being $n^{th}$ in series and/or $n^{th}$ in parallel in a common cathode arrangement. Microcontroller, uC/U1 (shown in broken form in both FIGS. 4A and 4B), controls the upper gate (UG) and lower gate (LG) drive timing to include very tight deadband and shoot-through control of switching the turn-on/off delays and propagation times for the metal-oxide-semiconductor field-effect transistors (MOSFETs) Q1 and Q2. Microcontroller uC also controls the isolated Gate Driver U2 integrated circuit (IC), U2's upper gate and lower gate on/off delays and propagation times.

Analog output, AO1, drives the current source amp U4 for reverse bias, $-I_f$, ramp control. The High Common Mode Differential Amp, U3, drives AN1 and monitors the dV/dt swing of the VCSEL drive pulse. AN2 (U4) monitors the actual reverse bias, $-I_f$, of the VCSEL under test.

Comparator input (CP1) is a high-speed comparator that may be state-variable programmed to interrupt the UG/LG drive signaling to Q1 and Q2 in the event of an over-current or fault detection. Digital Out 1 (DO1) can set a two-state gain ranging of the Diff Amp U3 so that both high voltage (×1) ad low voltage (×10) can be measured with one device.

Turning to FIG. 4B, the multi-channel driver may drive one or more VCSELs being $n^{th}$ in series and/or $n^{th}$ in parallel in a common anode configuration. In embodiments, $n^{th}$ channels of a power-switching may be performed. The discrete functions of the involved circuitry are similar to FIG. 4A, with the exception of the Gate Driver which may be implemented according to standard design practices.

Figure 5:
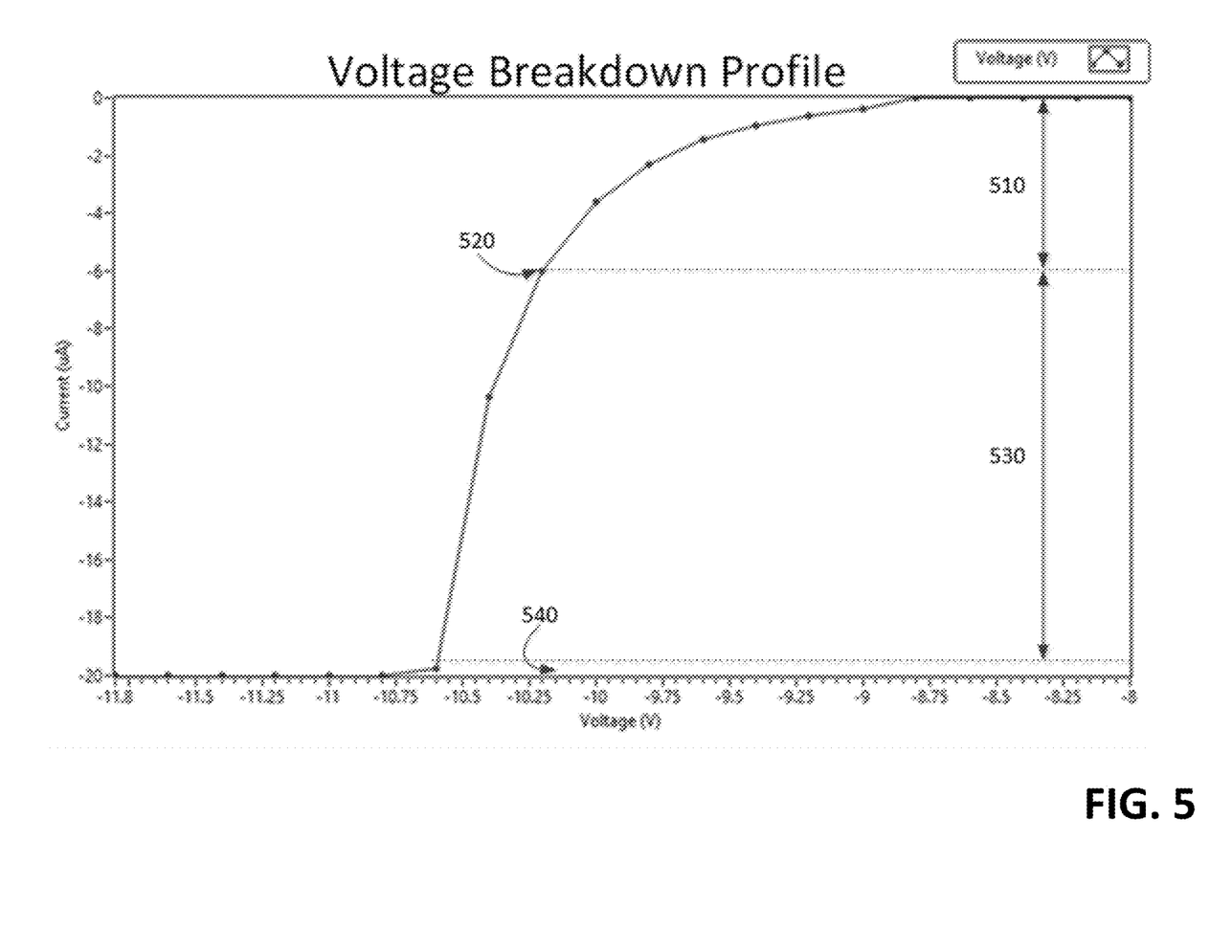
FIG. 5 illustrates a voltage breakdown profile in accordance with an embodiment.

FIG. 5 depicts a voltage breakdown profile which may occur during in-situ testing. The profile depicts an I-V curve resulting from a reverse bias voltage applied to a VCSEL system under operation or test. In region 510, when voltage is increased from approximately $-8V$ to $-10.25V$, the laser diode blocks the majority of current flow, and a small, but measurable reverse current leakage flows through the diode. The leakage current increases as voltage increases until the breakdown point 520 is reached, and the junction region of the diode begins to break down. At that point, a rapid increase of current begins to flow through the diode when only a small increase in voltage is applied. Current increases throughout the breakdown region 530 until a maximum current limit is approached 540, and the diode may become permanently damaged.

Reverse bias leakage of a laser diode is a sensitive indicator of the condition of the junction region of a laser diode, and can be used to monitor health and diagnose damage to the junction. An analysis of the reverse bias leakage using $V_{br}$ monitoring, junction temperature testing, and impedance spectroscopy, as described herein, may help to predict failure, and identify causes, such as excessive junction heating, electrostatic discharge, and pre-failure crystallographic defects.

In-Situ Junction Temperature Testing

Junction temperature is another characteristic that may be utilized to monitor the condition of VCSELs or VCSEL arrays. Junction temperature is the highest temperature at which a VSCEL or VSCEL array can operate. A VSCEL's junction temperature is a primary determinate for long-term reliability. PN Junction temperature is tightly coupled to forward and reverse current. Inversely, forward and reverse current affects junction temperature. As such, an in-situ forward or reverse bias stimulus on a VCSEL power supply can provide operational data that may be correlated to junction temperature and indicate the condition of the VCSEL. For example, empirical spectral wavelength drift may be correlated against $V_{br}$ parameters to calculate in-situ junction temperature. Calculations and results may be analyzed and stored in a lookup table (LUT) in firmware. Compiled data may be used to determine mean time between failure (MTBF) metrics for VCSELs and arrays. In particular, data from VCSEL operations under high and low temperatures may be utilized in predictive failure modeling. Embodiments may further include one or more methods and analyses applied in connection with $V_{br}$ ($-\Delta If/\Delta Vf$) slope monitoring to more accurately analyze and calculate predictive information.

Captured data may be used in real time to analyze and adjust the bias against ambient VCSEL operating conditions, such as inside a vehicle cabin or external vehicle temperatures, for example, when the VCSEL is part of a LIDAR system in a vehicle. In particular, data may be used to adjust one or more of the VCSEL power supply output voltage, current, and duty cycle operating points. Adjustments may be made to prevent VCSEL thermal rollover, which could lower system performance or even cause failure. Contrary to high-temperature thermal rollover, adjustments may be made in-situ to operate the VCSEL or array at a higher operating power point which may exceed nominal optical power performance maximums. Accordingly, a VCSEL system could be operated in a "pre-thermal rollover" mode, for example, which could operate at optimum power conversion efficiency throughout the VCSEL system's operation.

Figure 6:
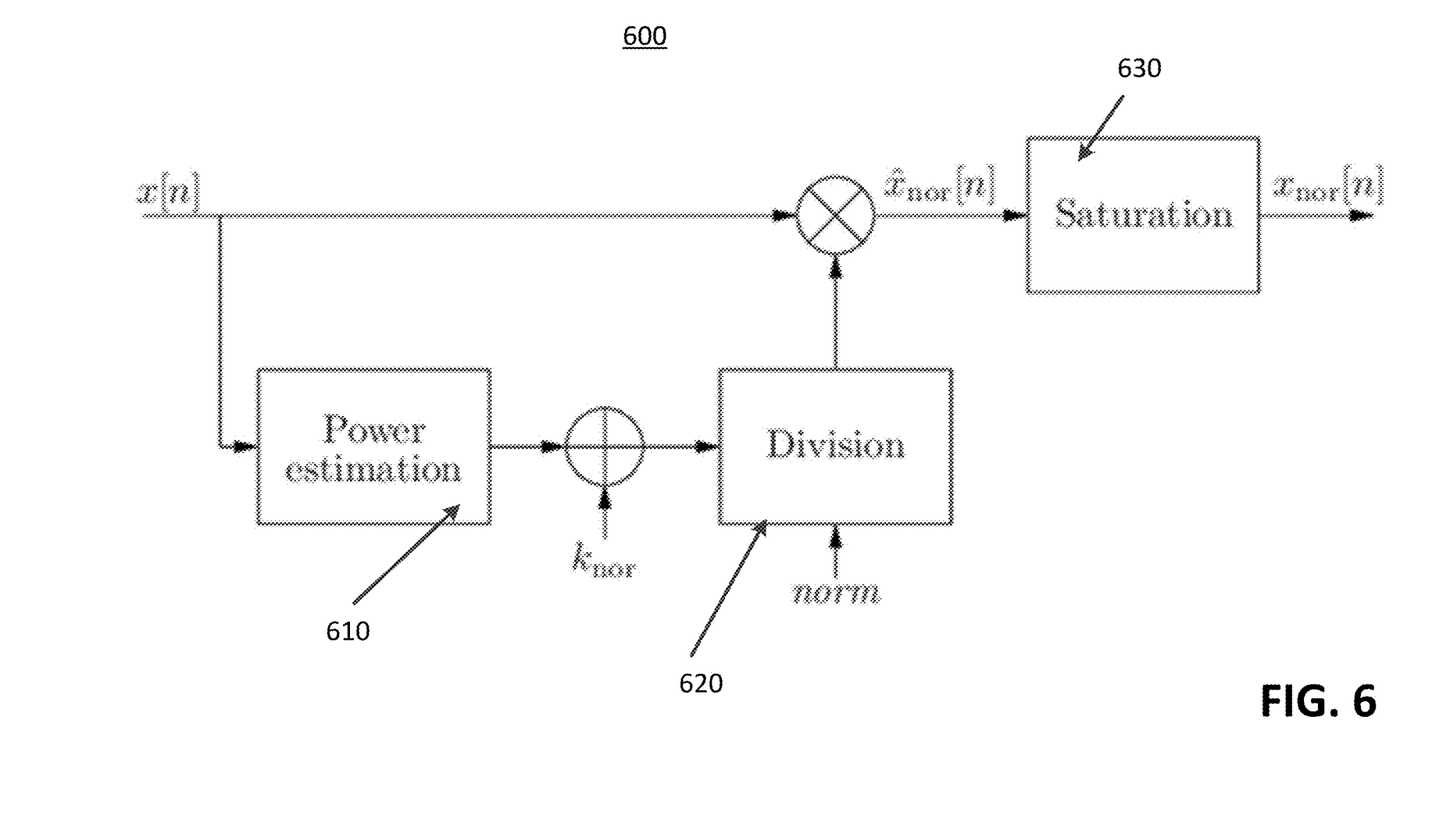
FIG. 6 illustrates a block diagram of an exemplary automatic gain control (AGC) for junction temperature derivation in accordance with an embodiment.

FIG. 6 illustrates a block diagram for an exemplary automatic gain control (AGC) system 600 that may implement one or more junction temperature derivations and analyses and prevent thermal rollover. The AGC is a closed-loop feedback circuit which can maintain a signal level output despite variation at the input signal. In the example, and input power x[n] is analyzed at a power estimation module 610 and normalized at a subsequent division module 620. The saturation module 630 then equalizes the normalized signal to the desired signal level range. As applied to embodiments described herein, an AGC system 600 may ensure that power input to the VCSEL system is maintained at the desired testing level. In another embodiment, utilizing a bipolar VCSEL driver circuit as described herein, a sensing circuit may obtain information regarding junction temperature, and output such information to a control circuit, which may adjust one or more aspects of the VCSEL driver circuit to adjust the junction temperature. In an example, the control circuit may adjust the forward or reverse bias stimulus to limit an increase in junction temperature, or reduce a high junction temperature. In other examples, the type of adjustments may vary depending on particular VCSEL or VCSEL array characteristics, to analyze degradation, monitor device health, or extend the operating life of VCSEL or VCSEL arrays.

In-Situ Impedance Spectroscopy

Figure 7A:
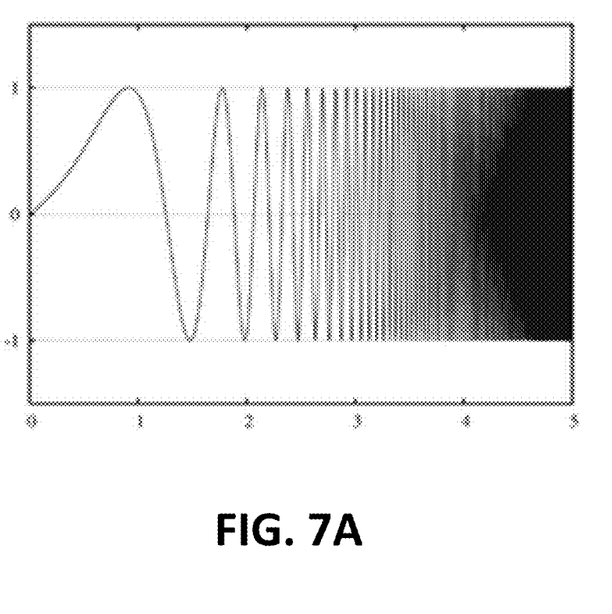
FIG. 7A illustrates an exponential chirp waveform for in-situ impedance spectroscopy in accordance with an embodiment.
Figure 7B:
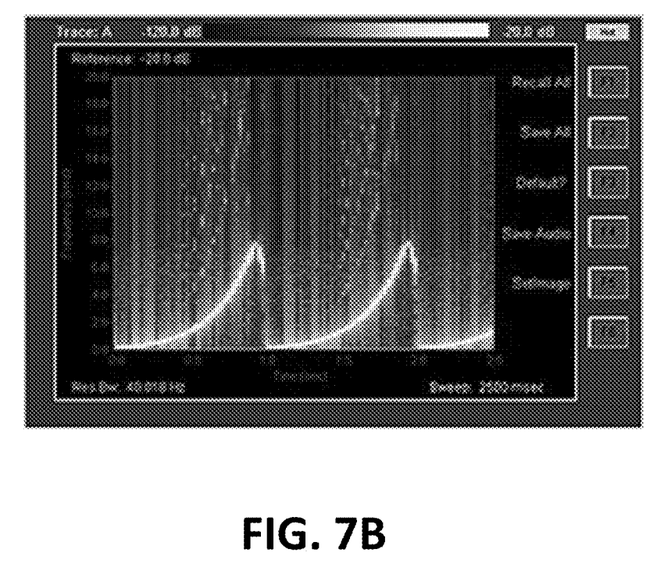
FIG. 7B illustrates a power spectrum of a sequence of chirped pulses for in-situ impedance spectroscopy in accordance with an embodiment.

The disclosed systems and methods may also incorporate impedance spectroscopy for testing the quality of VCSEL systems. As illustrated in FIGS. 7A and 7B, methods such as Exponential Chirp Generation may be utilized along with simulation models to derive a frequency of response of the internal construction of the VCSEL system. A chirp is a signal in which the frequency increases or decreases with time. In an exponential chirp, the frequency of response signal varies exponentially as a function of time. In an embodiment, a chirp signal may be generated with analog circuitry via a voltage-controlled oscillator and an exponentially ramping control voltage. In an embodiment, the simulation model may be a SPICE model, reduced to derive capacitance, inductance, and resistance to a resolution, and designed to provide both qualitative and quantitative outputs.

Exponential Chirp Generation provides a quick frequency response measure of a VCSEL or array under operation or test. This frequency response measure provides insight into the internal construction of the VCSEL. Frequency may be measured by:

$$f(t) = f_0 k^t \quad \text{Equation (2):}$$

wherein $f_0$ is an initial frequency, and k is an exponential rate of change of frequency with respect to time. In an embodiment, a multi-band chirp windowing may be applied to stimulate the VCSEL system in a short order, through controlling the rate of change, k, as follows:

$$k = \left(\frac{f_1}{f_0}\right)^{\frac{1}{T}} \quad \text{Equation (3)}$$

wherein $f_1$ is a final frequency, and T is the time it takes to sweep from $f_0$ to $f_1$.

FIG. 7A illustrates an example of a variable frequency, chirped waveform that may be applied in a reverse bias pulse to probe the complex impedance of VCSEL systems for acceptance testing. The chirped wave form of FIG. 7A illustrates a sinusoidal wave that increases in frequency exponentially over time. Similarly, the variable frequency reverse bias pulse drive capability may be applied to a forward current pulsed driver to analyze the complex impedance in between forward pulsed operations. Such examples may be applied to monitor the performance of the tested VCSELs, laser diodes, or arrays. In another embodiment, electrical characteristics of the forward current driver may be adjusted to optimize the optical power output and/or optical pulse shape from the laser diodes or arrays. This concept is illustrated in FIG. 7B, which depicts a power spectrum of a sequence of exponentially chirped pulses. In the power spectrum of FIG. 7B, the exponential rate of change of frequency is shown as a function of time. Any of these methods may be implemented in the VCSEL systems described herein, through one or more control circuits, for example, and interfaced with a power supply to provide pulses for a waveform response.

Figure 8:
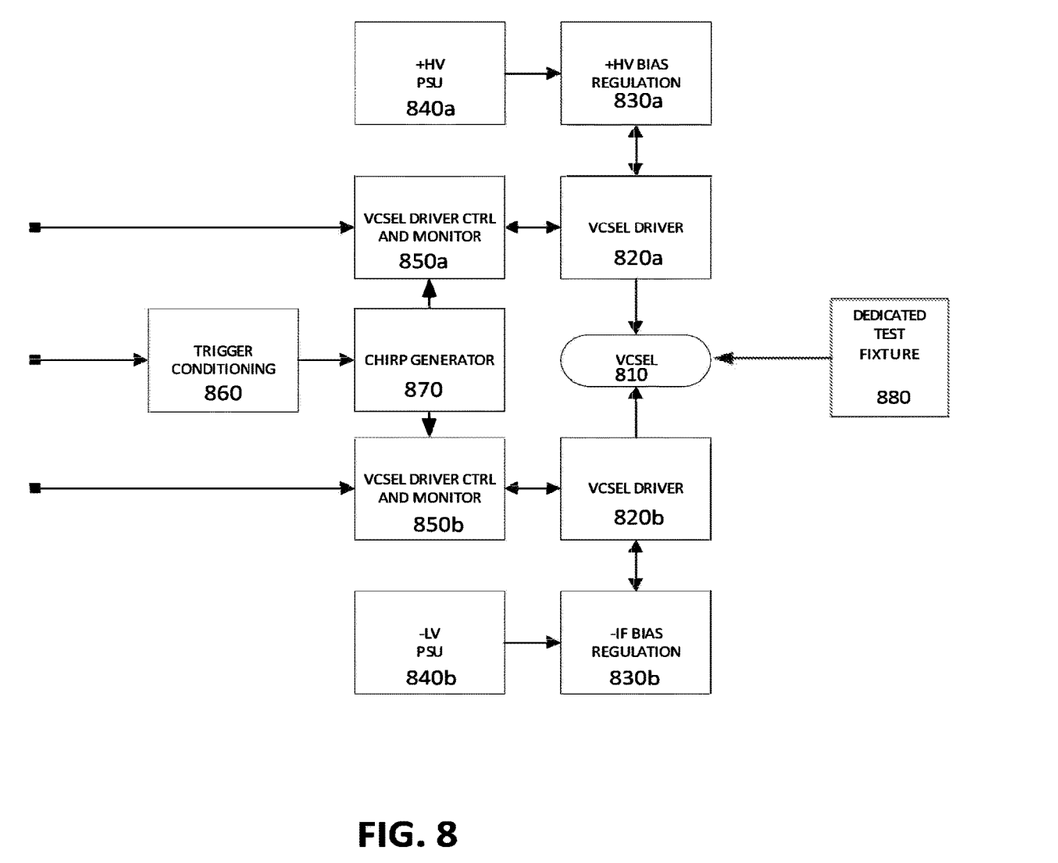
FIG. 8 illustrates a simplified version of a VCSEL driver circuit capable of in-situ exponential chirp generation in accordance with an embodiment.

FIG. 8 illustrates a high level block diagram for implementing one or more aspects of in-situ impedance spectroscopy analysis in a VCSEL driver circuit. A VCSEL 810 may be driven by two drivers 820 a and 820 b with a high voltage forward bias and a low voltage reverse bias, as described herein. VCSEL driver 820 a may provide the high-voltage forward bias pulses to the VCSEL, using a high voltage power supply unit 840 a regulated by +HV bias regulator 830 a. In a similar manner, the reverse bias driver 820 b may receive low voltage from power supply unit 840 b, regulated by the reverse bias, If, regulator 830 b. As described with respect to FIG. 3, the low voltage reverse bias pulses may be provided during the off-time 330 of the high voltage forward bias pulses of driver 820 a. Each VCSEL driver 820 a and 820 b may also be controlled and/or monitored by a control circuit 850 a and 850 b, respectively. The control circuits 850 a and 850 b may control the frequency of pulses, as well as compile waveform information, and other characteristics and response data from the VCSEL 810. A chirp generator 870, may be provided to the VCSEL system to obtain a frequency response measurement of the VCSEL system under test or operation. The chirp generator may be conditioned by trigger conditioning 860 based on desired testing parameters and conditions. A dedicated test fixture 880 may provide acceptance testing of the VCSEL 810. It will be appreciated that FIG. 8 depicts one example of a VCSEL driver circuit for implementing aspects of the present invention, and that many implementations, variations, and designs are possible, and may be varied.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the inventions disclosed herein. The accompanying claims and their equivalents are intended to cover such forms or modifications as would fall within the scope and spirit of certain of the inventions disclosed herein.

What is claimed:

1. A system comprising:
a vertical cavity surface emitting laser (VCSEL);
a driver circuit including a bipolar drive configured to:
provide one or more forward bias pulses to the VCSEL for light output, and
provide one or more reverse bias pulses after providing the one or more forward bias pulses and after a settling time period,
wherein a largest reverse bias voltage that is configured to be applied to the VCSEL is equivalent to a ratio of a change in reverse bias current to a change in forward bias voltage; and
a sensing circuit configured to:
monitor damage or degradation of the VCSEL based on the one or more reverse bias pulses.

2. The system of claim 1, wherein the sensing circuit is further configured to:
measure a reverse bias leakage current through the driver circuit during off-times of the one or more forward bias pulses.

3. The system of claim 1, wherein the sensing circuit is further configured to:
monitor a reverse bias leakage current relative to a breakdown threshold.

4. The system of claim 1, further comprising:
a control circuit configured to:
adjust current drive levels to the VCSEL; and
wherein the sensing circuit is further configured to:
provide feedback to the control circuit to enable the control circuit to adjust the current drive levels to extend a life of the VCSEL.

5. The system of claim 4, wherein the feedback is based on at least one of a measured reverse bias leakage current or a measured junction temperature of the VCSEL.

6. The system of claim 1, wherein the driver circuit is further configured to:
apply a voltage ramp up from a reverse bias breakdown voltage to an avalanche breakdown knee voltage to monitor a health state of the VCSEL.

7. The system of claim 1, wherein the sensing circuit is further configured to:
measure a junction temperature of the VCSEL.

8. The system of claim 1, further comprising:
a dedicated test fixture configured for acceptance testing of the VCSEL.

9. The system of claim 1, wherein the one or more reverse bias pulses comprise a plurality of frequencies.

10. The system of claim 9, wherein the plurality of frequencies are adjusted to optimize at least one of an optical power output or an optical pulse shape.

11. The system of claim 1, wherein at least one of the one or more forward bias pulses and the one or more reverse bias pulses comprises a variable chirped frequency.

12. The system of claim 11, wherein the variable chirped frequency is adjusted to optimize at least one of an optical power output and an optical pulse shape.

13. A method comprising:
applying, by a device and to a vertical cavity surface emitting laser (VCSEL), one or more forward bias pulses during an on-time of the VCSEL;
applying, by the device and to the VCSEL, one or more reverse bias pulses after applying the one or more forward bias pulses and after a settling time period,
wherein a largest reverse bias voltage that is applied to the VCSEL is equivalent to a ratio of a change in reverse bias current to a change in forward bias voltage; and
measuring, by the device at a sensing circuit, a reverse bias leakage current to monitor damage or degradation of the VCSEL.

14. The method of claim 13, wherein the reverse bias leakage current is measured relative to a breakdown threshold.

15. The method of claim 13, further comprising:
providing feedback to a control circuit to adjust current drive levels to extend a life of the VCSEL.

16. The method of claim 13, further comprising:
applying a voltage ramp up from a reverse bias breakdown voltage to an avalanche breakdown knee voltage to monitor a health state of the VCSEL.

17. The method of claim 13, further comprising:
measuring a junction temperature of the VCSEL.

18. The method of claim 17, further comprising adjusting current drive levels based on the junction temperature.

19. The method of claim 13, wherein at least one of the one or more forward bias pulses or the one or more reverse bias pulses comprises a variable chirped frequency.

20. The method of claim 19, wherein the variable chirped frequency is adjusted to optimize at least one of an optical power output or an optical pulse shape.

21. The method of claim 19, wherein the variable chirped frequency is used in a test mode to probe VCSEL impedance changes from at least one of environmental conditions, device damage, or aging.

* * * * *